US008273980B2

(12) United States Patent
Farquhar et al.

(10) Patent No.: US 8,273,980 B2
(45) Date of Patent: Sep. 25, 2012

(54) PHOTOVOLTAIC ROOF RIDGE CAP AND INSTALLATION METHOD

(75) Inventors: Donald Seton Farquhar, Niskayuna, NY (US); Charles Steven Korman, Schenectady, NY (US); Neil Anthony Johnson, Schenectady, NY (US); Ali Esat Iz, Bennington, VT (US)

(73) Assignee: General Electric Company, Niskayuna, NY (US)

( * ) Notice: Subject to any disclaimer, the term of this patent is extended or adjusted under 35 U.S.C. 154(b) by 1945 days.

(21) Appl. No.: 11/241,050

(22) Filed: Sep. 30, 2005

(65) Prior Publication Data

US 2007/0074754 A1    Apr. 5, 2007

(51) Int. Cl.
    *H01L 31/048*    (2006.01)
(52) U.S. Cl. ....................................... 136/251
(58) Field of Classification Search ............ 136/251
    See application file for complete search history.

(56) References Cited

U.S. PATENT DOCUMENTS

| 4,644,716 | A | * | 2/1987 | Neuroth ........................ 52/173.3 |
| 5,092,939 | A | | 3/1992 | Nath et al. ........................ 136/251 |
| 5,509,973 | A | * | 4/1996 | Ishikawa et al. ............... 136/251 |
| 5,590,495 | A | | 1/1997 | Bressler et al. ............... 52/173.3 |
| 5,665,607 | A | * | 9/1997 | Kawama et al. ................. 438/64 |
| 5,851,309 | A | * | 12/1998 | Kousa ............................. 136/248 |
| 6,875,914 | B2 | | 4/2005 | Guha et al. ..................... 136/251 |
| 2001/0054262 | A1 | * | 12/2001 | Nath et al. .................... 52/173.3 |
| 2002/0134421 | A1 | | 9/2002 | Nagao et al. |
| 2003/0150484 | A1 | * | 8/2003 | Winkeler ....................... 136/251 |
| 2004/0031219 | A1 | | 2/2004 | Banister |

FOREIGN PATENT DOCUMENTS

| CN | 1269452 A | 10/2000 |
| DE | 19644284 | 4/1998 |
| JP | 10089775 | 4/1998 |
| JP | 2003303989 A | 10/2003 |
| WO | 96/18857 A2 | 6/1996 |
| WO | WO9618857 | 6/1996 |

\* cited by examiner

*Primary Examiner* — Jennifer Michener
*Assistant Examiner* — Dustin Q Dam
(74) *Attorney, Agent, or Firm* — Ann M. Agosti

(57) ABSTRACT

A photovoltaic roofing system and a method of installing the photovoltaic ridge cap structure have been provided. The photovoltaic roofing system includes a ridge cap adapted to cover a ridge of a roof structure. The system also includes at least one photovoltaic cell disposed within the ridge cap. The method of installing a photovoltaic ridge cap structure includes mounting the ridge cap over multiple photovoltaic cells along a ridge of a roof structure. The method further includes routing electrical leads from each photovoltaic cell through one or more openings along the ridge of the roof structure.

13 Claims, 9 Drawing Sheets

PHOTOVOLTAIC ROOF RIDGE CAP AND INSTALLATION METHOD

BACKGROUND

The invention relates generally to photovoltaic roof systems and, more particularly to, a system and method of integrating photovoltaic (PV) modules into new or existing roof structures.

Photovoltaic modules include a group of photovoltaic cells, also referred to as solar cells that are connected in series or in parallel and are encapsulated in an environmentally protective laminate. The photovoltaic cells, which are the basic building blocks of photovoltaic modules, convert solar radiation to electrical energy. Conversion of solar energy into electrical energy includes reception of light, such as sunlight, absorption of sunlight into the solar cell, generation and separation of positive and negative charges creating a voltage in the solar cell, and collection and transfer of electrical charges through a terminal coupled to the solar cell.

Photovoltaic energy is becoming a significant source of electrical power. In addition to the use of free-standing photovoltaic modules, roofs on residential and commercial building are well suited for mounting photovoltaic devices. However, it is desirable to integrate the photovoltaic device directly into the roofing structure as opposed to mounting a standard general purpose photovoltaic module on the top of an existing roof. To achieve widespread acceptance and use of photovoltaic devices on rooftops they must satisfy aesthetic requirements, and thus must integrate in appearance and configuration with the conventional roof. Moreover, they must meet all the requirements of conventional roofing materials, including ease of installation, weather tightness, fire resistance, resistance to locally anticipated weather conditions, proximate availability of materials, as well as meeting local codes and conventions. Above and beyond the requirements for conventional roofing products, photovoltaic roofing materials must provide a means for electrical connections from unit to unit, and ultimately connection into the building. For example there are a range of existing photovoltaic roof products designed to replace or augment standard roof tiles or shingles yet these photovoltaic roof tiles each have an electrical feed leading to the integrated photovoltaic cells. However, the standard roof structure does not include an electrical feed conduit for each individual photovoltaic roof tile. Thus, considerable modification is necessary to incorporate the photovoltaic roof tiles into the roof structure. Moreover, the large number of photovoltaic roof tiles or shingles (and associated electrical leads) can result in a greater likelihood of water leakage through the roof structure.

Hence, an improved technique is needed for incorporating photovoltaic modules into a roof structure.

BRIEF DESCRIPTION

In accordance with one aspect of the invention, a photovoltaic roofing system is provided. The photovoltaic roofing system includes a ridge cap adapted to cover a ridge of a roof structure. It also includes at least one photovoltaic cell disposed within the ridge cap.

In accordance with another aspect of the present invention, a method of installing a photovoltaic ridge cap structure over a roof system is provided. The method includes mounting a ridge cap over multiple photovoltaic cells along a ridge of a roof structure is provided. The method also includes routing one or more electrical leads from the multiple photovoltaic cells through one or more openings along the ridge of the roof structure.

DRAWINGS

These and other features, aspects, and advantages of the present invention will become better understood when the following detailed description is read with reference to the accompanying drawings in which like characters represent like parts throughout the drawings, wherein.

Figure 8:
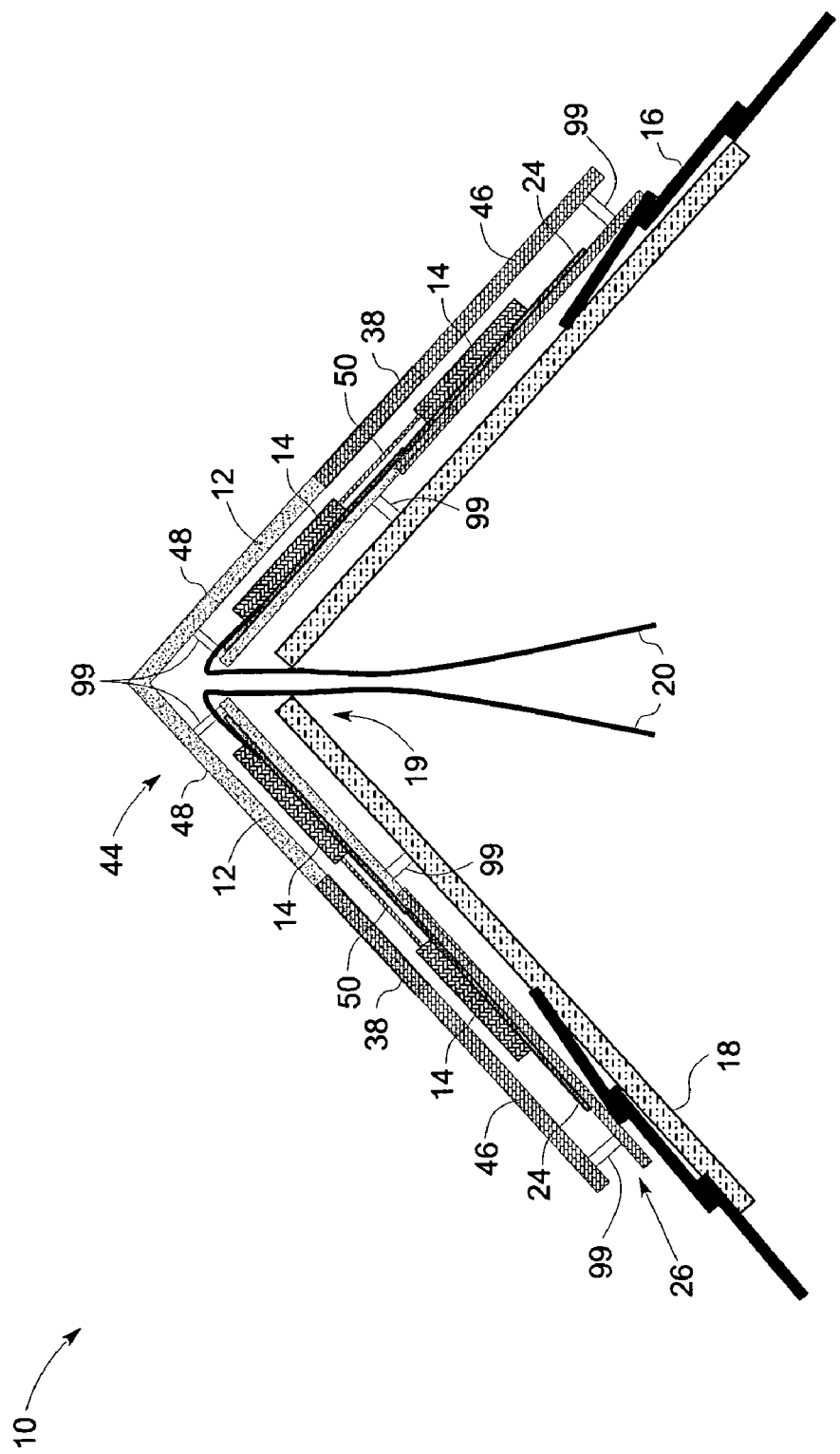
Figure 9:
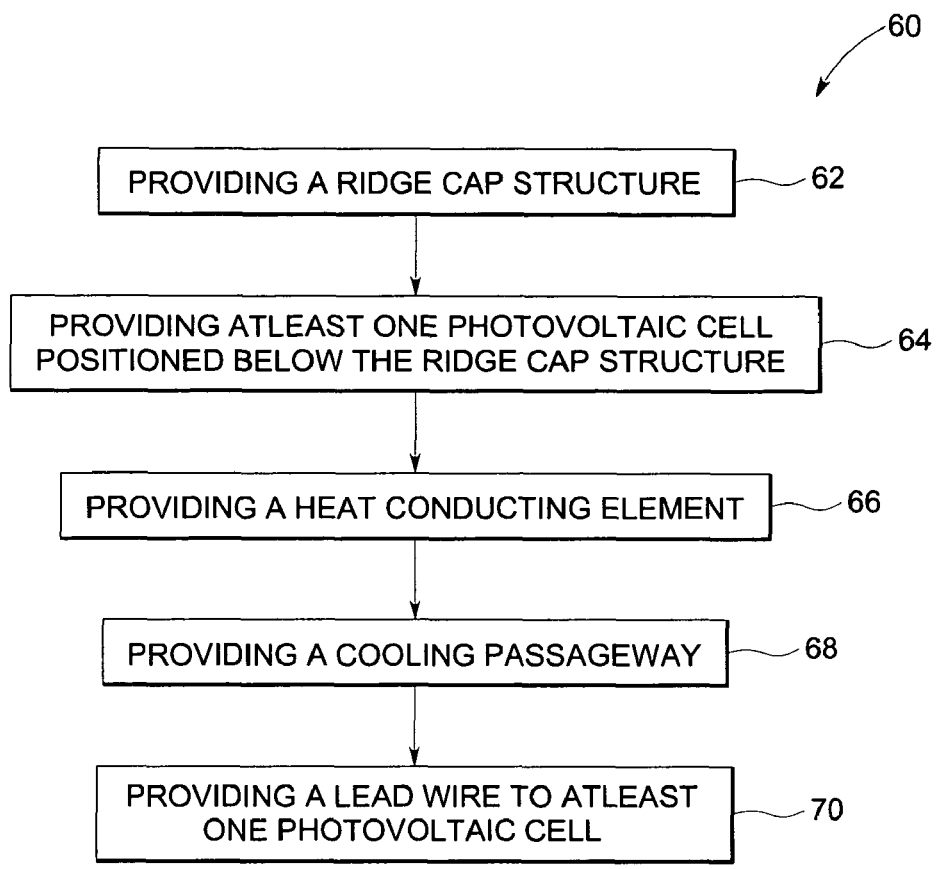
Figure 10:
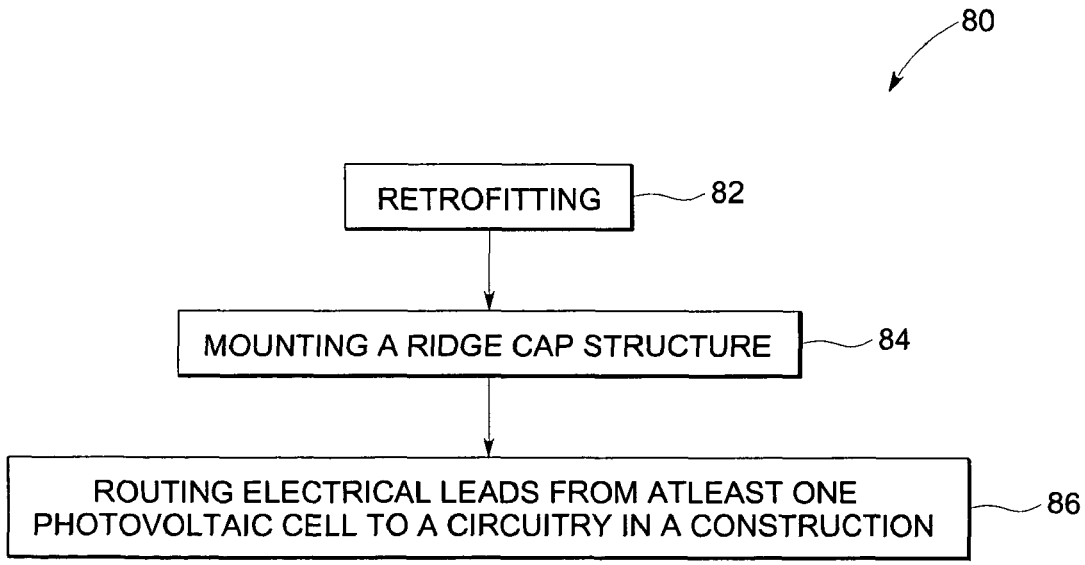

FIG. 8 is a diagrammatical illustration of an alternative embodiment of the photovoltaic ridge cap structure, wherein a support structure having two rows of photovoltaic modules on each side of the roof structure is disposed about the ridge separately from a modular ridge cap structure comprising an upper and lower light directing or concentrating portion, and the photovoltaic modules are offset from the upper and lower light directing or concentrating portions of the cap structure;

FIG. 9 is a partial top perspective view of a building structure having an embodiment of the photovoltaic ridge cap structure disposed on a roof structure; and FIG. 10 is a partial cross-sectional view of a photovoltaic cell located beneath the ridge cap in accordance with embodiments of the present invention.

DETAILED DESCRIPTION

As discussed in detail below, embodiments of the present invention provide a roofing system having a photovoltaic panel in a ridge cap or a ridge vent. In a typical peaked roof, shingling or tiling proceeds from the eaves to the ridge in an overlapping manner. At the peak of the roof, along the ridge, a roofing element referred to as a ridge cap is installed and overlays the last course of shingle or tile or other roofing material to prevent leakage. The ridge cap may provide ventilation to an attic space. The photovoltaic roofing system disclosed herein also includes at least one photovoltaic cell disposed within the ridge cap. The ridge cap includes a light concentration feature comprising multiple optical components configured to concentrate or direct solar energy towards each photovoltaic cell. The ridge cap also includes means for providing heat dissipation from the solar cell, by means of conduction, convention or radiation so as to increase its conversion efficiency.

Two functions of the photovoltaic ridge cap are a roofing function and a photovoltaic function. The roofing function includes providing a ridge covering structure or shape that matches the pitch of roof and seals the ridge. In some embodiments of the present invention, the angle for mounting the photovoltaic ridge cap is equal to the geographical latitude of the mounting location, for maximum efficiency. In a non-limiting example, if the photovoltaic ridge cap were mounted at a geographical location of latitude 35° (degrees), an ideal angle for mounting would be 35°. In certain embodiments, the roofing function may include an inverted V-shaped cover to extend over a ridge vent opening in such a manner as to prevent rain and water from passing through the openings while permitting air circulation for ventilation.

The photovoltaic function includes providing a photovoltaic cell configured for producing electricity when exposed to photons from a solar spectrum. In certain embodiments, the photovoltaic function may further include providing the photovoltaic ridge cap with a light directing or concentrating feature comprising optical elements to concentrate light that impinges on the photovoltaic ridge cap and to direct the light to a photovoltaic cell. Some non-limiting examples of optical elements include reflectors, mirrors, refractive lenses, fresnel lenses, and optical coatings. Non-limiting examples of optical element materials include plastic and glass. The various embodiments of the invention can be better understood by the following descriptions of diagrammatical illustrations.

Figure 1:
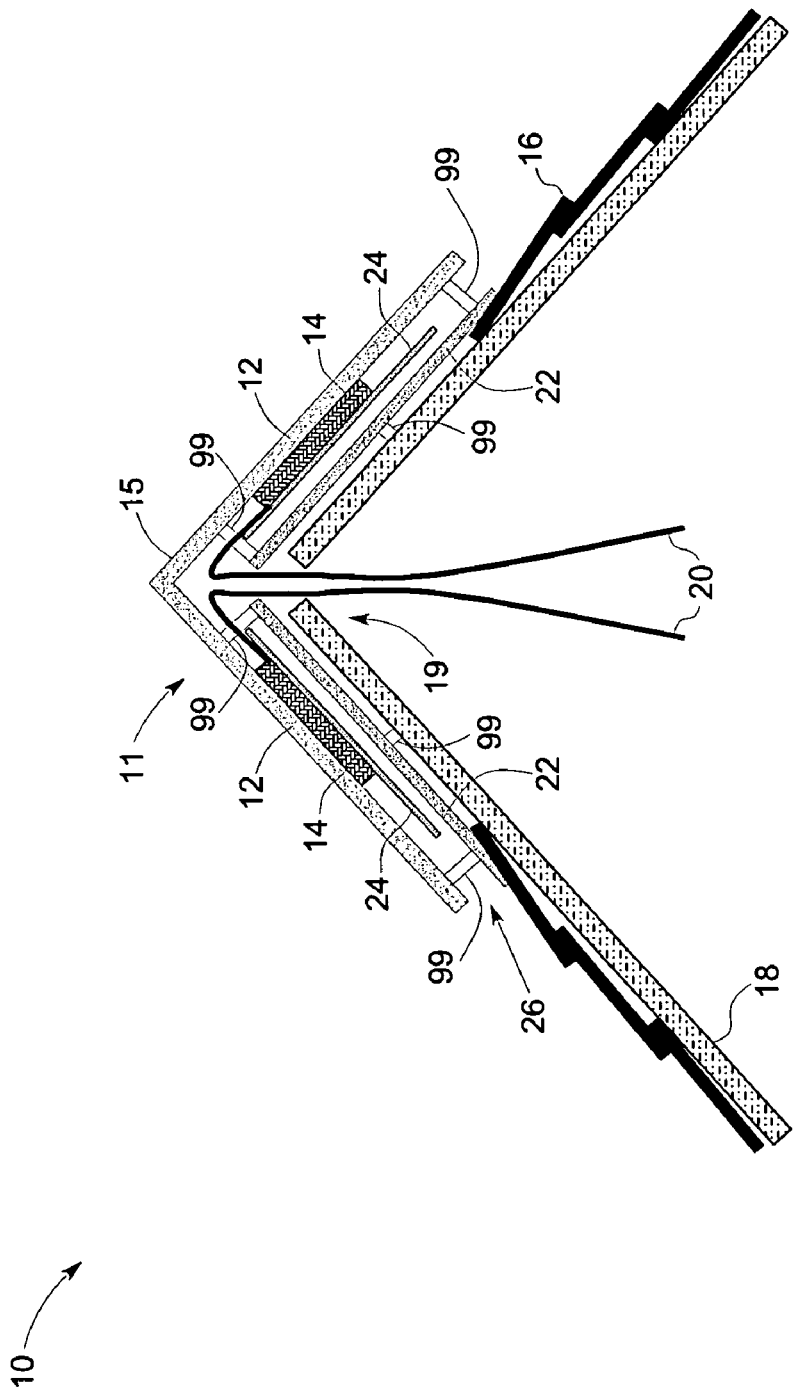
FIG. 1 is a diagrammatical illustration of a photovoltaic ridge cap structure having one row of photovoltaic modules disposed on each side of a roof structure about a ridge, wherein the photovoltaic modules are disposed in contact with a light directing or concentrating portion of the cap structure in accordance with certain embodiments of the present invention.

FIG. 1 is a cross-sectional side view of an embodiment of a photovoltaic roofed building or roofing system 10 having a photovoltaic ridge cap structure 11. The illustrated photovoltaic ridge cap structure 11 includes a light directing or concentrating system 12 and one or more rows of photovoltaic modules 14 disposed on one or both sides of an outer inverted V-shaped cover structure 15. The photovoltaic module 14 consists of photovoltaic cell or cells that are mounted into a package that typically consists of a transparent substrate to admit light, and an encapsulating material to attach the cells to the substrate, and a backsheet material to protect the package. There are various packaging configurations known in the art, the details of which depend on the thickness and size and type of the photovoltaic cell among other factors. The light directing or concentrating system 12 may be integral with, or a portal into, the cover structure 15. Moreover, the light directing or concentrating system 12 may include a variety of optical materials, reflectors, index matching layers or films, lenses, and so forth. For example, the light directing or concentrating system 12 may include a glass or plastic material with a fresnel lens, which focuses the light toward to the photovoltaic modules 14. As another example, if bi-facial solar cells are incorporated in the module 14, then a reflector may be disposed behind the cells to reflect light back toward the cells. The cover structure 15 and/or the light directing or concentrating system 12 may be constructed of a variety of materials, such as polycarbonate, polyvinyl chloride, glass, wood, metal, or combinations thereof. The system 12 may re-direct or concentrate incident solar energy to the module 14 in the case in which the ridge cap outer surface 15 is designed to blend with a roof pitch that is not directly orthogonal to the sun.

The photovoltaic ridge cap structure 11 is disposed generally symmetrically about opposite sides of an outer roof structure 16 disposed on inner roof support structure or roof sheathing 18. For example, the roof structure 16 may include a variety of shingles or tiles, while the inner roof support structure 18 may include trusses (not shown), sheets of plywood or other materials, roofing underlay and so forth. As illustrated, the photovoltaic ridge cap structure 11 is disposed over a ridge vent or opening 19, which facilitates air circulation and routing of electrical cables or wiring 20 to the rows of photovoltaic modules 14 all in a centralized location. For example, the ridge vent or opening 19 may include a plurality of openings or an elongated opening extending lengthwise along the peak or ridge of the roof structure 16. Thus, depending on the number of individual photovoltaic modules in the rows 14, the electrical cables 20 may be bundled together into one or more groups, which can then be connected to a power source inside the photovoltaic roofed building or roofing system 10.

Figure 3:
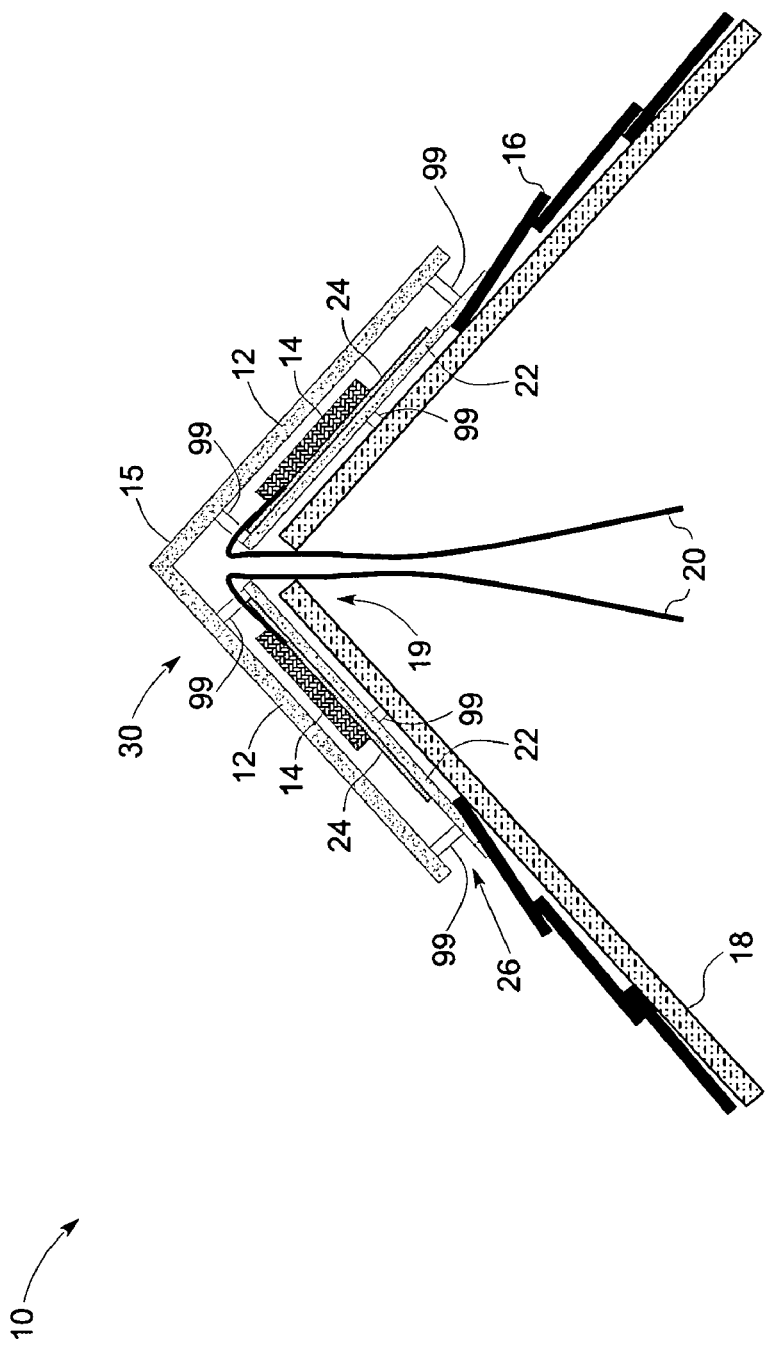
FIG. 3 is a diagrammatical illustration of an alternative embodiment of the photovoltaic ridge cap structure, wherein one row of photovoltaic modules is disposed on each side of the roof structure about the ridge, and the photovoltaic modules are offset from the light directing or concentrating portion of the cap structure.

In the illustrated embodiment of FIG. 1, the photovoltaic ridge cap structure 11 includes an inner support or mounting structure 22 having an inverted V-shaped geometry in an offset position relative to, i.e. spaced apart, from the outer inverted V-shaped cover structure 15 and lens element 12. In contrast, FIG. 3 illustrates an embodiment having the photovoltaic modules 14 disposed in direct contact, or adhered to, or in close proximity with the light directing or concentrating system 12 of the outer inverted V-shaped cover structure 15. The close proximity or contact between the light directing or concentrating system 12 and the photovoltaic modules 14 may substantially increase the transmission of light to the photovoltaic modules 14. However, as discussed below, other embodiments have the photovoltaic modules 14 in an offset relationship from the outer inverted V-shaped cover structure 15. The outer cover structure 15, the inner mounting structure 22 and the inner roof support structure 18 are held together by supports 99.

These inner and outer structures 15 and 22 may be fabricated as one or more modular structures along with the light directing or concentrating system 12 and the photovoltaic modules 14, such that the photovoltaic ridge cap structure 11 can be quickly and easily installed or retrofitted to the photovoltaic roofed building or roofing system 10. For example, the entire photovoltaic ridge cap structure 11 may be constructed offsite, and then subsequently transported and installed onto a conventional roof structure to form photovoltaic roofed building or roofing system 10, thus requiring little of no modification to the existing roof structure. The ridge cap structure 10 may be attached to the roof with nails, screws, clips or any other means known to those skilled in the art. In some embodiments, the photovoltaic ridge cap structure 11 may be constructed as a plurality of modular units or standard sections, e.g., 1 to 5 meters or longer. In this manner, the modular units can be quickly and easily coupled together lengthwise along the ridge of the photovoltaic roofed building or roofing system 10. The inner support or mounting structure 22 may include a variety of mounts, seals, or fastening devices, such as flanges, flashings, nail plates, and so forth.

In accordance with embodiments of the present invention, the system 11 may include a variety of cooling mechanisms, such as a heat conducting element or heat sink 24 and a convective cooling or venting path 26 between the inner and outer structures 15 and 22. In one embodiment, thermal gradients may facilitate natural convective cooling of the photovoltaic modules 14 via the heat sink 24 and the venting path 26. In another example, a fan or blower may blow air across the heat sink 24 through the venting path 26 to force convective cooling of the photovoltaic modules 14. In a further embodiment, the heat sink 24 may include heat pipes and a liquid cooling system, which may carry heat away from the photovoltaic modules 14.

Figure 2:
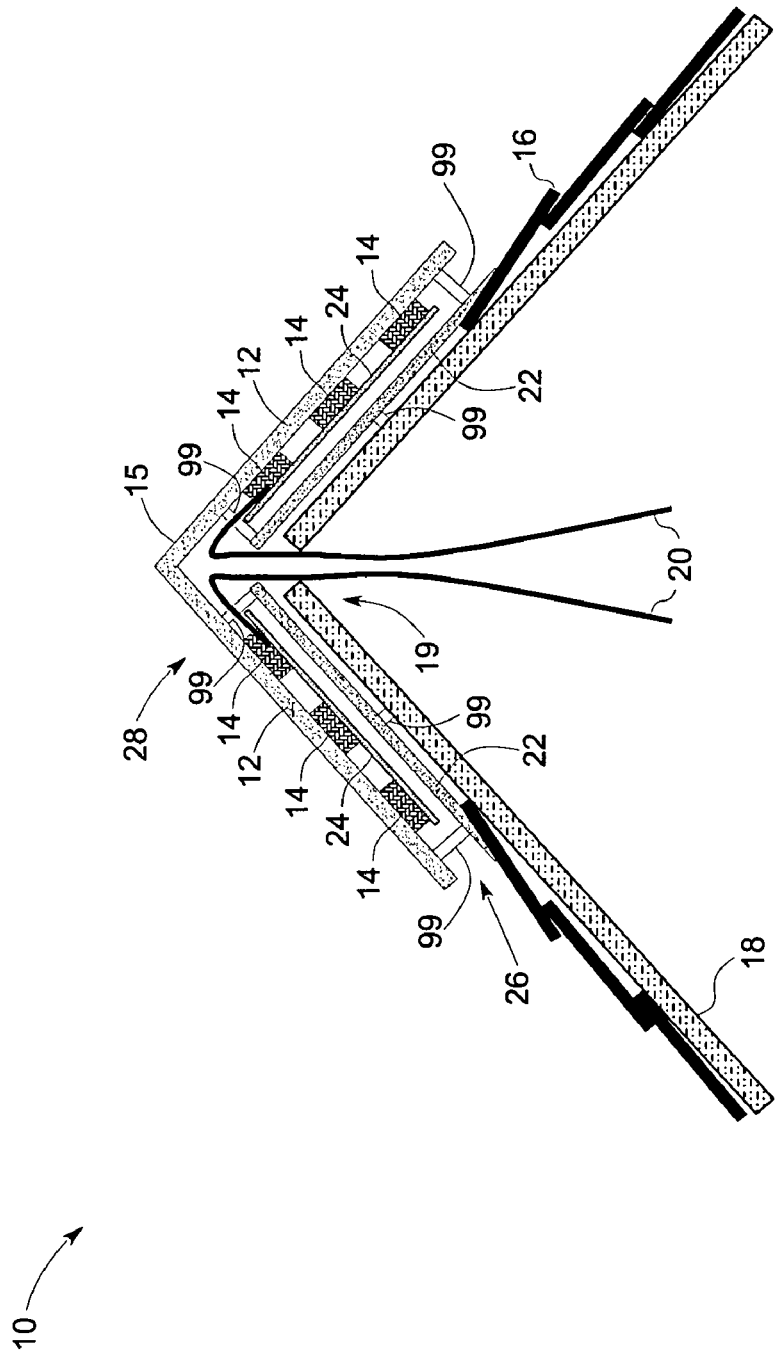
FIG. 2 is a diagrammatical illustration of an alternative embodiment of the photovoltaic ridge cap structure, wherein three rows of photovoltaic modules are disposed on each side of the roof structure about the ridge, and the photovoltaic modules are disposed in contact with the light directing or concentrating portion of the cap structure.

As mentioned above, the system 10 may have a variety of geometries, material compositions, and general configurations in various embodiments of the present invention. FIG. 2 illustrates an embodiment of the photovoltaic roofed building or roofing system 10 having a photovoltaic ridge cap structure 28, wherein three rows of photovoltaic modules 14 are disposed on each side of the ridge vent or opening 19 along the ridge of the roof structure 16. In other embodiments, the photovoltaic ridge cap structure 28 may include 2, 4, 5, or any number of rows of the photovoltaic modules 14 on each side of the ridge vent 19. Similar to the embodiment of FIG. 1, the illustrated embodiment of FIG. 2 has the photovoltaic modules 14 in direct contact with, or adhered to, or in general close proximity with the light directing or concentrating system 12. However, other embodiments of the photovoltaic ridge cap structure 28 have the photovoltaic modules 14 in an offset and/or angled relationship relative to the underside of the light directing or concentrating system 12 and the outer structure 15.

FIG. 3 illustrates another embodiment of the photovoltaic roofed building or roofing system 10 having a photovoltaic ridge cap structure 30, wherein one row of photovoltaic modules 14 is disposed in an offset parallel relationship below the light directing or concentrating system 12 (and the outer structure 15) on each side of the roof structure 16. In certain embodiments, the offset may be selected to improve the focus or magnification of light toward the photovoltaic modules 14, or to improve the cooling of the photovoltaic modules 14. For example, the light directing or concentrating system 12 may include lenses or a lens-like pattern having a focal length corresponding to the offset between the photovoltaic modules and the light directing or concentrating system 12. In this manner, the focus or magnification of the light improves the efficiency of the photovoltaic modules 14. Moreover, the offset may reduce heat transfer (e.g., via conduction) from the photovoltaic ridge cap structure 30 into photovoltaic modules 14. Again, as mentioned above, the photovoltaic modules 14 also may be angled (rather than parallel) relative to the underside of the light directing or concentrating system 12 and the outer structure 15.

Figure 4:
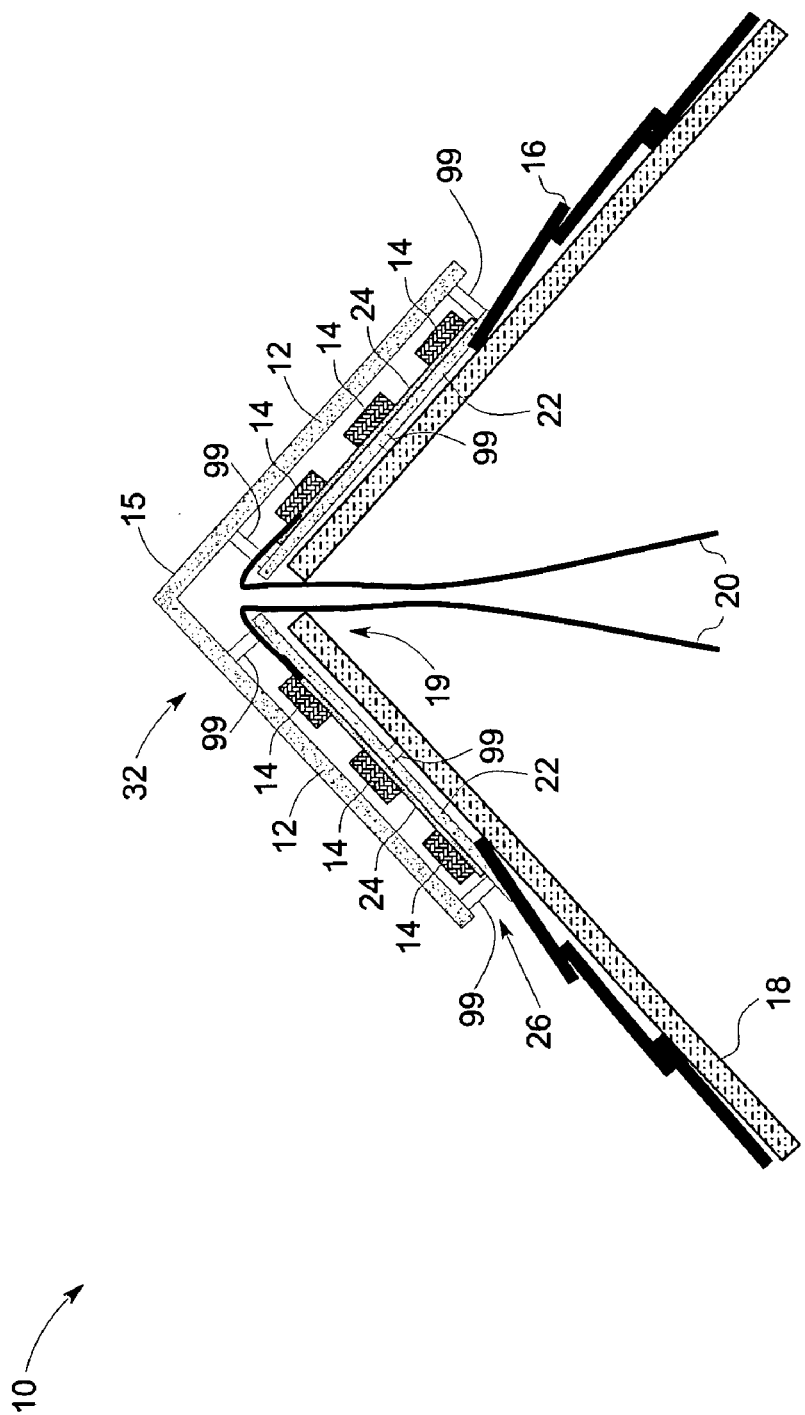
FIG. 4 is a diagrammatical illustration of an alternative embodiment of the photovoltaic ridge cap structure, wherein three rows of photovoltaic modules are disposed on each side of the roof structure about the ridge, and the photovoltaic modules are offset from the light directing or concentrating portion of the cap structure.

FIG. 4 illustrates a further embodiment of the photovoltaic roofed building or roofing system 10 having a photovoltaic ridge cap structure 32, wherein three rows of photovoltaic modules 14 are disposed in an offset parallel relationship below the light directing or concentrating system 12 (and the outer structure 15) on each side of the ridge vent or opening 19 along the ridge of the roof structure 16. As mentioned above, the offset may be selected to improve the focus or magnification of light toward the photovoltaic modules 14, thereby improving the efficiency or performance of the photovoltaic modules 14. The offset also may be selected to improve the cooling of the photovoltaic modules 14 by, for example, reducing heat transfer (e.g., via conduction) from the photovoltaic ridge cap structure 30 into photovoltaic modules 14. In other embodiments, the photovoltaic modules 14 may be angled (rather than parallel) relative to the underside of the light directing or concentrating system 12 and the outer structure 15.

Figure 5:
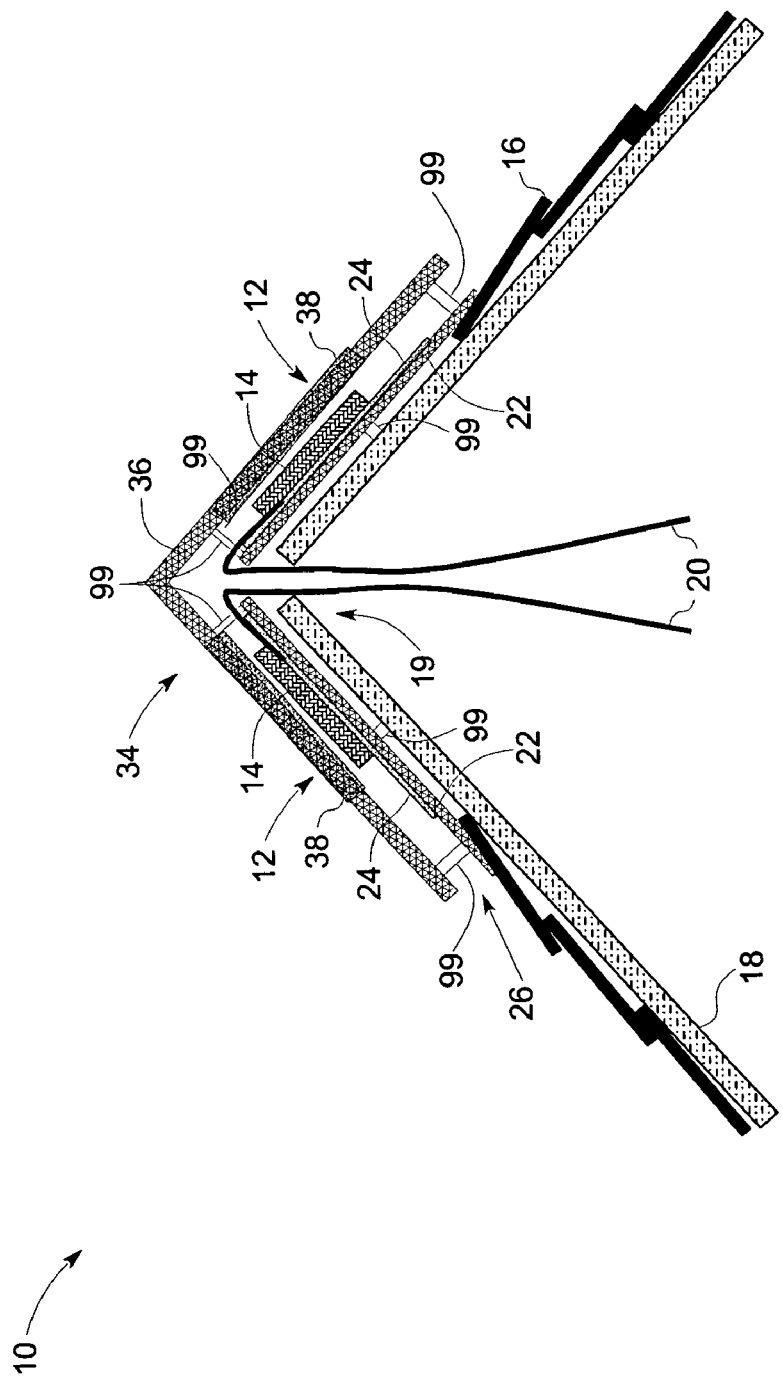
FIG. 5 is a diagrammatical illustration of an alternative embodiment of the photovoltaic ridge cap structure, wherein one row of photovoltaic modules is disposed on each side of the roof structure about the ridge, and the photovoltaic modules are offset from a light directing or concentrating window within the cap structure.

In accordance with another embodiment of the present invention, FIG. 5 is an illustration of a photovoltaic ridge cap structure 34 that includes a row of photovoltaic modules 14 disposed on each side of a roof structure 16 in an offset parallel relationship below a ridge cap 36. The illustrated photovoltaic ridge cap structure 34 also includes a window or portal light directing or concentrating system 38 disposed directly above the photovoltaic modules 14. The spacing between the photovoltaic modules 14 and the photovoltaic ridge cap structure 34 with the window or portal light concentration system 38 provides substantially improved design latitude for achieving optimum magnification that improves the efficiency of the photovoltaic modules 14. Note that compared to photovoltaic roofing tile or shingle, the ridge vent can accommodate a greater thickness and still blend aesthetically with the roofing. The spacing also may improve the cooling of the photovoltaic modules 14 by, for example, reducing heat transfer (e.g., via conduction) from the photovoltaic ridge cap structure 40 into photovoltaic modules 14. In one embodiment, the ridge cap 36 is made of a widely used inexpensive polymer for example, polyvinyl chloride. Some examples of materials used in the window 38 are glass and polycarbonate.

Figure 6:
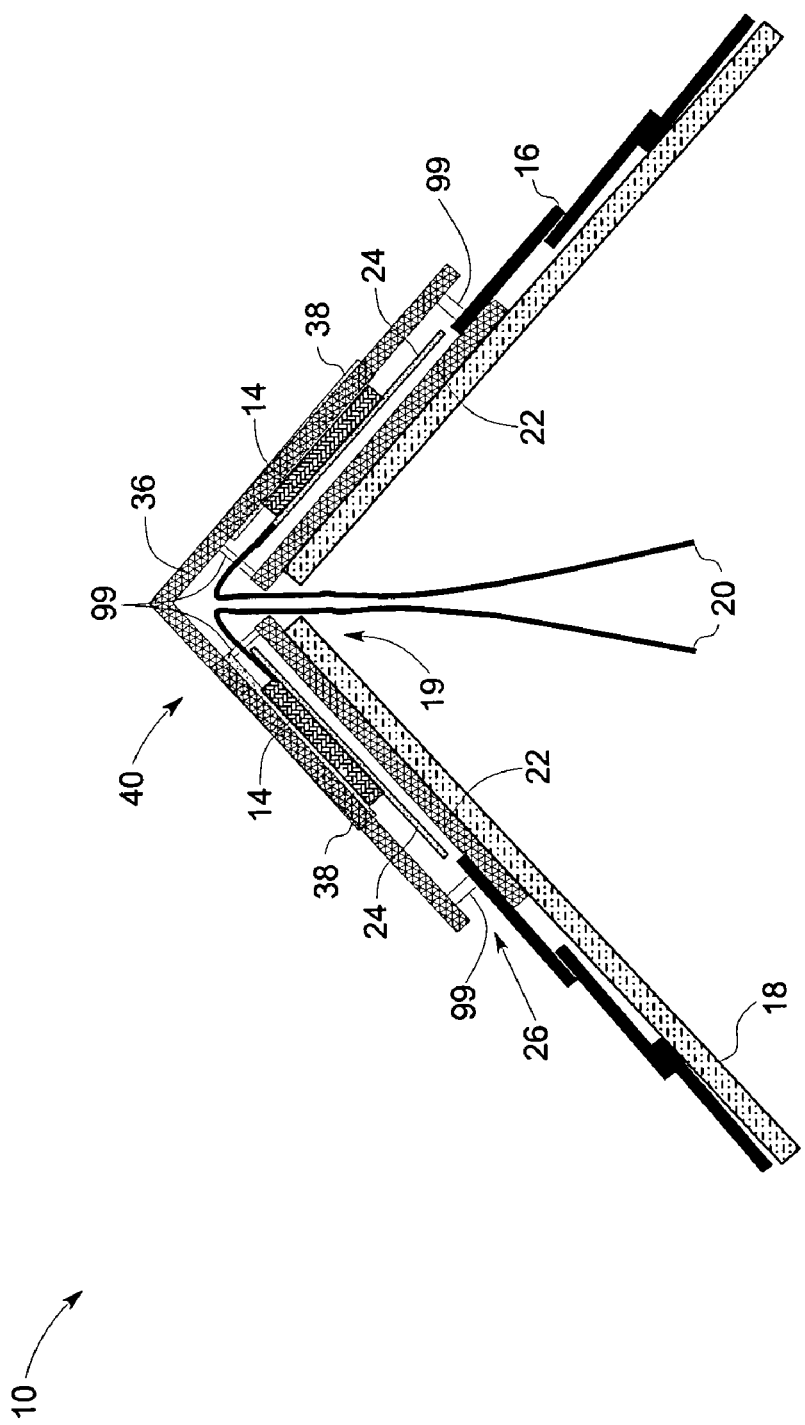
FIG. 6 is a diagrammatical illustration of an alternative embodiment of the photovoltaic ridge cap structure, wherein one row of photovoltaic modules is disposed on each side of the roof structure about the ridge separately from the cap structure, and the photovoltaic modules are offset from the light directing or concentrating window within the cap structure.

FIG. 6 illustrates an embodiment of the photovoltaic roofed building or roofing system 10 having a photovoltaic ridge cap structure 40 that includes a row of photovoltaic modules 14 that are disposed on each side of a roof structure 16 in direct contact with, or adhered to, or in close proximity with an underside of the window 38 in the ridge cap 36. In the illustrated embodiment of FIG. 6, the photovoltaic modules 14 are sandwiched between the windows 38 and the heat sinks 24. The embodiment of FIG. 6 also has the inner structure 22 disposed under the roof structure 16, e.g., shingles or tiles. However, other configurations are within the scope of the present invention.

Figure 7:
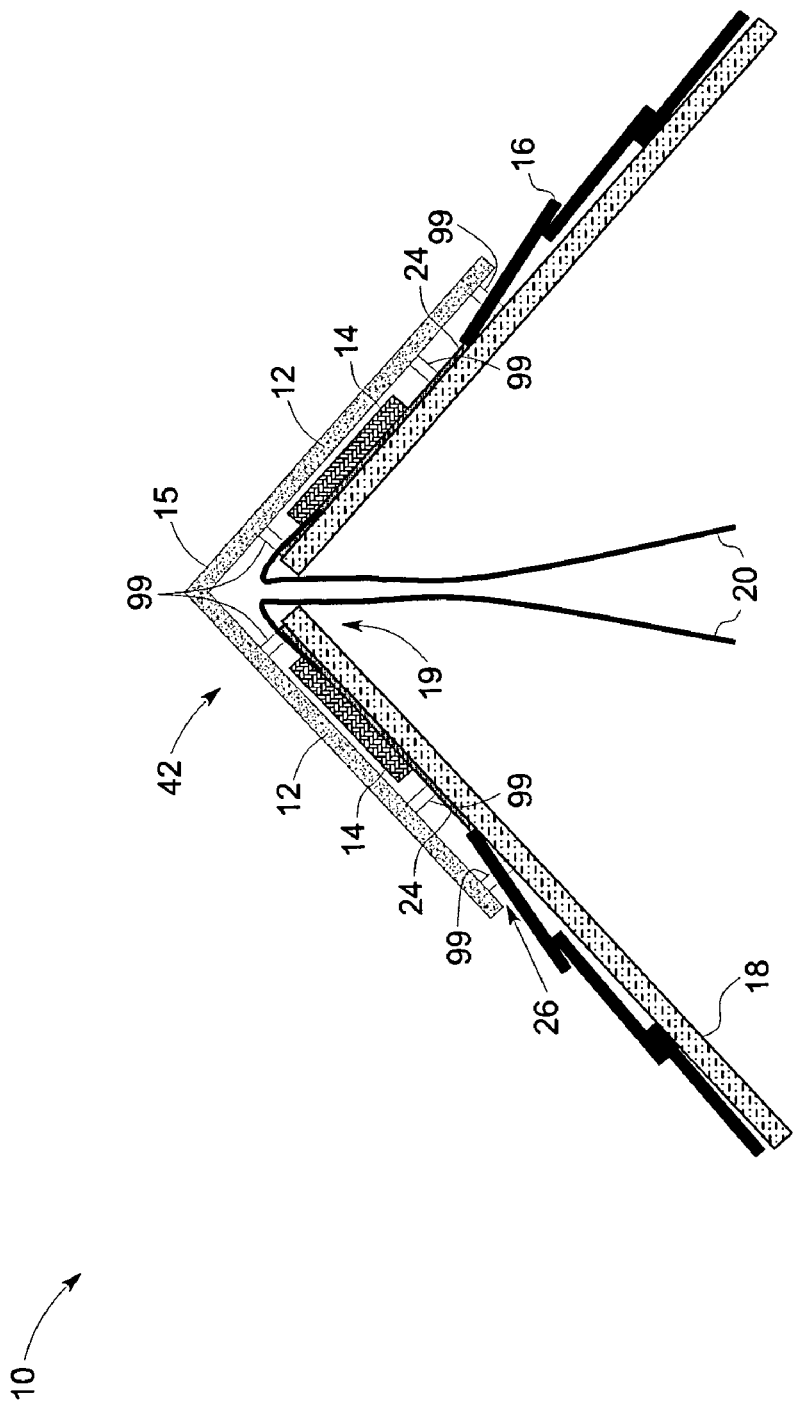
FIG. 7 is a diagrammatical illustration of an alternative embodiment of the photovoltaic ridge cap structure, wherein one row of photovoltaic modules is disposed on each side of the roof structure about the ridge, and the photovoltaic modules are offset from the light directing or concentrating portion of the cap structure and in direct contact with roof tiles.

FIG. 7 illustrates a further embodiment of the photovoltaic roofed building or roofing system 10 having a photovoltaic ridge cap structure 42 that includes a row of photovoltaic modules 14 disposed on each side of the roof structure 16 in an offset parallel relationship relative to an underside of the light directing or concentrating system 12. In addition, the heat sinks or heat conducting elements 24 supporting the photovoltaic modules 14 are disposed in contact with, or adhered to, or in close proximity with the roof structure 18. Again, the spacing between the photovoltaic modules 14 and the light directing or concentration system 12 provides desirable magnification that improves the efficiency of the photovoltaic modules 14. The optimal spacing depends on many factors including the size of the photovoltaic cells. The spacing also may improve the cooling of the photovoltaic modules 14 by, for example, reducing heat transfer (e.g., via conduction) from the photovoltaic ridge cap structure 42 into photovoltaic modules 14. In the illustrated embodiment, the heat sinks or heat conducting elements 24 supporting the photovoltaic modules 14 may be separate from the outer structure 15 and light directing or concentrating system 12 of the photovoltaic ridge cap structure 42. Accordingly, the heat sinks or heat conducting elements 24 supporting the photovoltaic modules 14 may be mounted directly onto the roof structure 18, followed by independent mounting of the outer structure 15 having the light directing or concentrating system 12.

FIG. 8 illustrates an additional embodiment of the photovoltaic roofed building or roofing system 10 having a photovoltaic ridge cap structure 44, wherein the photovoltaic modules 14 and the light directing or concentrating system 12 are disposed over a greater surface area and dimension from the ridge downwardly over the roof structures 16 and 18 as compared to the embodiments of FIGS. 1-7. In view of this greater surface area, the photovoltaic ridge cap structure 44 can collect light and generate greater electricity than the embodiments of FIGS. 1-7. For example, the illustrated photovoltaic ridge cap structure 44 includes an outer extension section 46 to provide addition surface area beyond a central section 48, wherein both sections 46 and 48 cover the ridge vent 19 and the photovoltaic modules 14. In the illustrated embodiment, the photovoltaic ridge cap structure 44 includes two rows of photovoltaic modules 14 that are disposed on each side of the roof structure 16 in a generally parallel offset relationship below the light directing or concentrating system 12. The photovoltaic modules 14 are also electrically coupled via wiring 50. Other embodiments may have a greater number or surface area of these photovoltaic modules 14. For example, if the photovoltaic ridge cap structure 44 generally produces about 200 W/m$^2$ (Watt/square meter), then a surface area of 10 square meters would produce about 2000 Watts. If greater power (e.g., 3000 Watts) is desired, then the surface area may be increased (e.g., 15 square meters).

FIG. 9 illustrates an exemplary method 60 of manufacturing a photovoltaic roofing system or building in accordance with certain embodiments of the present invention. The method 60 includes providing a ridge cap structure adapted to cover a ridge of a roof structure (block 62). The method 60 further includes providing at least one photovoltaic cell positioned below (and optionally mounted to) the ridge cap (block 64). The method 60 also optionally includes providing a heat conducting element or heat sink coupled to each photovoltaic cell (block 66). The method 60 further includes providing a cooling passageway or a venting path within the ridge cap (block 68). Finally, the method 60 includes providing a lead wire to each photovoltaic cell 70 for electrical connection to circuitry within a roofing system or building via a ridge opening or vent.

FIG. 10 illustrates a method 80 of installing a photovoltaic ridge cap structure over a preexisting roof structure or building. The method 80 includes retrofitting at block 82, which may include removing a preexisting ridge cap and creating one or more openings in the roof structure. The method 80 also includes mounting a ridge cap over multiple photovoltaic cells along the ridge of the roof structure 84. The method 80 further includes routing electrical leads from each photovoltaic cell 86 through the openings along the ridge of the roof structure. In certain embodiments of the present invention, the photovoltaic ridge cap is adapted for installation after conventional roofing shingles or tiles have been installed. The photovoltaic ridge cap can be installed as a final or close to final step in a roofing installation.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A photovoltaic roofing system, comprising:
a ridge cap configured to cover a ridge of a roof structure, the ridge cap comprising an angle substantially matched to an angle of the ridge of a roof structure;
at least one photovoltaic cell disposed within the ridge cap and adjacent the ridge of a roof structure; electrical wiring coupled to the photovoltaic cells and leading to a ridge opening; and wherein the ridge cap comprises a venting path disposed over a front, or back, or the front and the back of the at least one photovoltaic cell.

2. The photovoltaic roofing system of claim 1, wherein the ridge cap includes a light directing or concentration feature configured to direct or concentrate solar energy toward the at least one photovoltaic cell.

3. The photovoltaic roofing system of claim 1, wherein the at least one photovoltaic cell includes a plurality of photovoltaic cells disposed below opposite sides of the ridge cap.

4. The photovoltaic roofing system of claim 1, wherein the ridge cap comprises a window having a light directing or concentration feature disposed above the at least one photovoltaic cell.

5. The photovoltaic roofing system of claim 4, wherein the window comprises polycarbonate or glass.

6. The photovoltaic roofing system of claim 1, wherein the ridge cap comprises polyvinyl chloride or polycarbonate.

7. The photovoltaic roofing system of claim 1, wherein the at least one photovoltaic cell is adhesively coupled to a transparent or translucent substrate.

8. The photovoltaic roofing system of claim 1, wherein the ridge cap and the at least one photovoltaic cell are integrated into a ridge cap assembly.

9. The photovoltaic roofing system of claim 8, wherein the ridge cap assembly comprises a plurality of modular sections, each modular section including one or more photovoltaic cells.

10. The photovoltaic roofing system of claim 1, comprising a heat sink coupled to the at least one photovoltaic cell.

11. The photovoltaic roofing system of claim 1, comprising a means for providing convective air flow over a surface of the at least one photovoltaic cell.

12. A method, comprising:
providing a ridge cap configured to cover a ridge of a roof structure, by substantially matching an angle of the ridge cap with an angle the roof structure adjacent the ridge;
providing at least one photovoltaic cell within the ridge cap and adjacent the ridge of the roof structure; providing a lead wire to the at least one photovoltaic cell, wherein the lead wire is adapted to enter the roof structure along an opening in the ridge; and wherein the ridge cap comprises a venting path disposed over a front, or back, or the front and the back of the at least one photovoltaic cell.

13. The method of claim 12, comprising integrating the ridge cap and the at least one photovoltaic cell into a ridge cap assembly adapted to mount over the ridge of the roof structure.

* * * * *